United States Patent
Marks et al.

(10) Patent No.: US 11,156,926 B2
(45) Date of Patent: Oct. 26, 2021

(54) VACUUM ACTUATOR CONTAINMENT FOR MOLECULAR CONTAMINANT AND PARTICLE MITIGATION

(71) Applicant: KLA CORPORATION, Milpitas, CA (US)

(72) Inventors: Zefram D. Marks, Fremont, CA (US); Gildardo R. Delgado, Livermore, CA (US); Rudy Garcia, Union City, CA (US); Joseph Walsh, Soquel, CA (US); Matthew Hoffman, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/986,751

(22) Filed: Aug. 6, 2020

(65) Prior Publication Data

US 2021/0048756 A1 Feb. 18, 2021

Related U.S. Application Data

(60) Provisional application No. 62/885,798, filed on Aug. 12, 2019.

(51) Int. Cl.
*G03F 7/20* (2006.01)

(52) U.S. Cl.
CPC ...... *G03F 7/70916* (2013.01); *G03F 7/70033* (2013.01); *G03F 7/70833* (2013.01); *G03F 7/70841* (2013.01)

(58) Field of Classification Search
CPC ............ G03F 7/70916; G03F 7/70833; G03F 7/70841; G03F 7/70033; G03F 1/84; G03F 7/70825; G03F 7/70808; G03F 7/709; G03F 1/66; G02B 21/0016; G02B 21/26; G01N 21/956; G01N 15/10; F16F 15/0232; H01J 21/67126; H01J 37/18; H01J 37/16; B82Y 10/00; C23C 16/52; C23C 14/042; C23C 16/4412; C23C 16/4485; F16K 7/14; F16K 27/00; H01L 21/67748; H01L 21/67017; H01L 21/67167; B08B 7/00; A47L 9/20

See application file for complete search history.

(56) References Cited

U.S. PATENT DOCUMENTS

| 7,821,617 B2 | 10/2010 | Hara |
| 9,268,031 B2 | 2/2016 | Umstadter |
| 2001/0005944 A1 | 7/2001 | Dao et al. |
| 2005/0035684 A1* | 2/2005 | Fuse ............... H01L 41/053 310/311 |

(Continued)

OTHER PUBLICATIONS

WIPO, ISR for PCT/US2020/045684, Nov. 25, 2020.

*Primary Examiner* — Mesfin T Asfaw
(74) *Attorney, Agent, or Firm* — Hodgson Russ LLP

(57) ABSTRACT

An actuator for an optic mount in a vacuum environment includes a bellows around an actuator compartment. The bellows provides a seal around the actuator. A filter assembly is positioned between the actuator compartment and an interior of a vacuum chamber. The filter assembly includes a first particle filter, a second particle filter, and a purifier medium between the first particle filter and the second particle filter. Vacuum conditions in the actuator compartment can be achieved with a pump for the vacuum chamber, but particles and contaminants from the actuator or actuator compartment are captured by the filter assembly.

20 Claims, 5 Drawing Sheets

(56) References Cited

U.S. PATENT DOCUMENTS

2005/0286029 A1 12/2005 Ham et al.
2007/0121091 A1 5/2007 Sogard
2013/0235357 A1 9/2013 Delgado et al.
2013/0255407 A1 10/2013 Chilese et al.
2014/0116920 A1 5/2014 Lee et al.

\* cited by examiner

VACUUM ACTUATOR CONTAINMENT FOR MOLECULAR CONTAMINANT AND PARTICLE MITIGATION

CROSS-REFERENCE TO RELATED APPLICATIONS

This application claims priority to the provisional patent application filed Aug. 12, 2019 and assigned U.S. App. No. 62/885,798, the disclosure of which is hereby incorporated by reference.

FIELD OF THE DISCLOSURE

This disclosure relates to optical equipment for semiconductor inspection or metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

The continued shrinking of design geometries in integrated circuit devices generates a continual need for improved optical inspection and metrology tools. For example, light sources for photolithography systems have historically evolved to smaller and smaller wavelengths, thereby allowing the construction of smaller and smaller structures. For instance, the use of visible wavelength light (e.g., 400 nm) gave way to near ultraviolet light (e.g., 300 nm), which then gave way to deep ultraviolet (DUV) light (e.g., 200 nm). Then, more recently, DUV light sources have given way to extreme ultraviolet (EUV) sources (e.g., 13.5 nm).

With feature sizes in semiconductor technologies getting increasingly smaller, the wavelength of light has become a limiting factor in optical processes used in semiconductor processes, including lithography and wafer and mask inspection and metrology. Advanced optical technologies use EUV light (for example, wavelengths in the range of 11 nm to 15 nm and more specifically wavelengths of 13.5 nm) to address issues resulting from increasingly smaller features sizes, and a bright EUV light source free of debris is invaluable in the pursuit of next generation semiconductor processes. One challenging aspect of developing a bright EUV light source is to mitigate debris from the plasma generation process while minimizing the loss of EUV light produced by the plasma.

One disadvantage of inspection tools operating in the EUV regime is that a particle protection device, such as a pellicle, which is commonly used in tools at longer wavelengths, cannot be used in EUV settings because the protection device is opaque at EUV wavelengths. Furthermore, the critical dimensions of the reticles intended to be inspected on a EUV tool may be so small that nearly any particle present on the reticle surface will cause unacceptable problems. By way of example, the contaminant particles may emanate from nearby optics used to direct inspection light to the reticle. In addition, the reticle stage used to move the reticle during inspection also may be a source of contaminant particles.

Furthermore, some of the optics in an EUV or other vacuum environment inspection system will need to be actuated for alignment reasons. This requires precise (e.g., sub-nanometer) accurate movement for one or more degree of freedom. In addition, some optics are large (e.g., several kilograms) and require actuation force to move. These optics are moved in vacuum. The exposed optic surface is sensitive to contamination, both from volatile organic compounds (VOCs) and from particles. The VOCs can be contaminants. The actuators required to move the optics can outgas volatile hydrocarbons. This actuation can generate particles that could land on critical surfaces within the system.

Presently, particle control in light-based reticle inspection systems is carried out with flowing air, which pushes the particles in a known direction. In vacuum systems, such as in electron beam inspect systems, particle control is done with slight amounts of positive pressure and particle reduction methods designed to reduce the number of particles in general. The previous methods have several disadvantages. For example, they have not shown a capability to eliminate particles down to 10 nm in diameter. In addition, previous methods have only been used in processes that allow reticle cleaning after inspection. However, the EUV reticle inspection tool must contend with smaller particles since no cleaning is allowed after inspection.

Differential pumping can be used to separate the vacuum environment containing an outgassing part. A differentially pumped vacuum region requires connection to pumping system. This can be difficult to achieve for a vacuum chamber within a larger assembly. In addition, the vacuum pump can create vibrations that are detrimental to precision aligned optics.

Cleaning processes can reduce the outgassing rate from components. Most actuators contain lubricants or other materials that outgas and can never be fully mitigated. In addition, during movement additional molecular and particle contaminants are generated that cannot be totally removed with cleaning.

Therefore, improved systems and methods of particle mitigation are needed.

BRIEF SUMMARY OF THE DISCLOSURE

A system is provided in a first embodiment. The system includes a vacuum chamber; an optic mount disposed in the vacuum chamber; an optical component disposed on the optic mount in the vacuum chamber; a base; a bellows disposed between the base and the optic mount; an actuator disposed in the actuator compartment; and a filter assembly disposed in fluid communication between the actuator compartment and an interior of the vacuum chamber. The bellows, the base, and the optic mount define an actuator compartment therebetween. The bellows provides a seal between the base and the optic mount. The actuator is configured to move the optic mount relative to the base. The filter assembly includes a first particle filter, a second particle filter, and a purifier medium disposed between the first particle filter and the second particle filter.

The filter assembly can be disposed in the base.

In an instance, the system further includes a gas pathway disposed on the base. The gas pathway is in fluid communication between the actuator compartment and the vacuum chamber. The filter assembly is disposed in the gas pathway.

The bellows can be fabricated of stainless steel or other materials.

At least one of the first particle filter and the second particle filter can be a mesh of metal or a sintered metal. The purifier medium can include at least one of activated carbon, a zeolite, a silica gel, or a polymer. In an instance, the first particle filter and the second particle filter are a mesh of metal and the purifier medium includes activated carbon.

The system can include a plurality of baffles disposed on the optic mount on a side of the bellows opposite the actuator compartment. The baffles extend toward the base.

The filter assembly can capture more than 90% of particles that have a diameter of 3 nm or larger.

The optical component can be configured for use at extreme ultraviolet wavelengths.

An extreme ultraviolet semiconductor inspection tool can include the system of the first embodiment.

A method is provided in a second embodiment. An optical component is provided on an optic mount in a vacuum chamber. An actuator disposed between the optic mount and a base is provided. A bellows is disposed between the base and the optic mount. The bellows, the base, and the optic mount define an actuator compartment therebetween. The bellows provides a seal between the base and the optic mount.

A pressure is reduced in the vacuum chamber and in the actuator compartment with a vacuum pump. Gas evacuated from the actuator compartment passes through a filter assembly between the actuator compartment and the vacuum chamber. The filter assembly includes a first filter, a purifier medium, and a second filter.

The filter assembly can be disposed in the base or in a gas pathway disposed on the base.

The first filter and/or the second filter can be a mesh made of metal. The purifier medium can include at least one of activated carbon, a zeolite, a silica gel, or a polymer. In an instance, the first filter and the second filter are a mesh made of metal and the purifier medium includes activated carbon.

The method can further include moving the optic mount relative to the base using the actuator.

The method can further include directing a beam of extreme ultraviolet light through the vacuum chamber at the optical component.

The filter assembly can capture more than 90% of particles that have a diameter of 3 nm or larger.

The pressure can be less than $10^{-6}$ Torr.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Aspects of the present disclosure are directed to mitigating damage due to debris in the optical path of a plasma-produced light source, particularly EUV light generated by laser-produced plasma and discharge-produced plasma used in next generation semiconductor fabrication processes, including wafer and mask inspection, metrology, and lithography. A sealed actuator compartment has a connection to a greater vacuum environment that is permeable to gas but impermeable to particles and VOC. This reduces particle count and eliminates extra pumps that otherwise cause vibration.

To mitigate these issues with in-situ optic actuation, the entire active actuation assembly is positioned in a gas-sealed environment. The walls of the enclosure are a flexible vacuum material, such as a stainless steel bellows. To pump out atmospheric gas from the enclosed region and to prevent large pressure gradients between the regions, the enclosure can allow flow into the outside vacuum through a series of particle and molecular contaminate filters.

Figure 1:
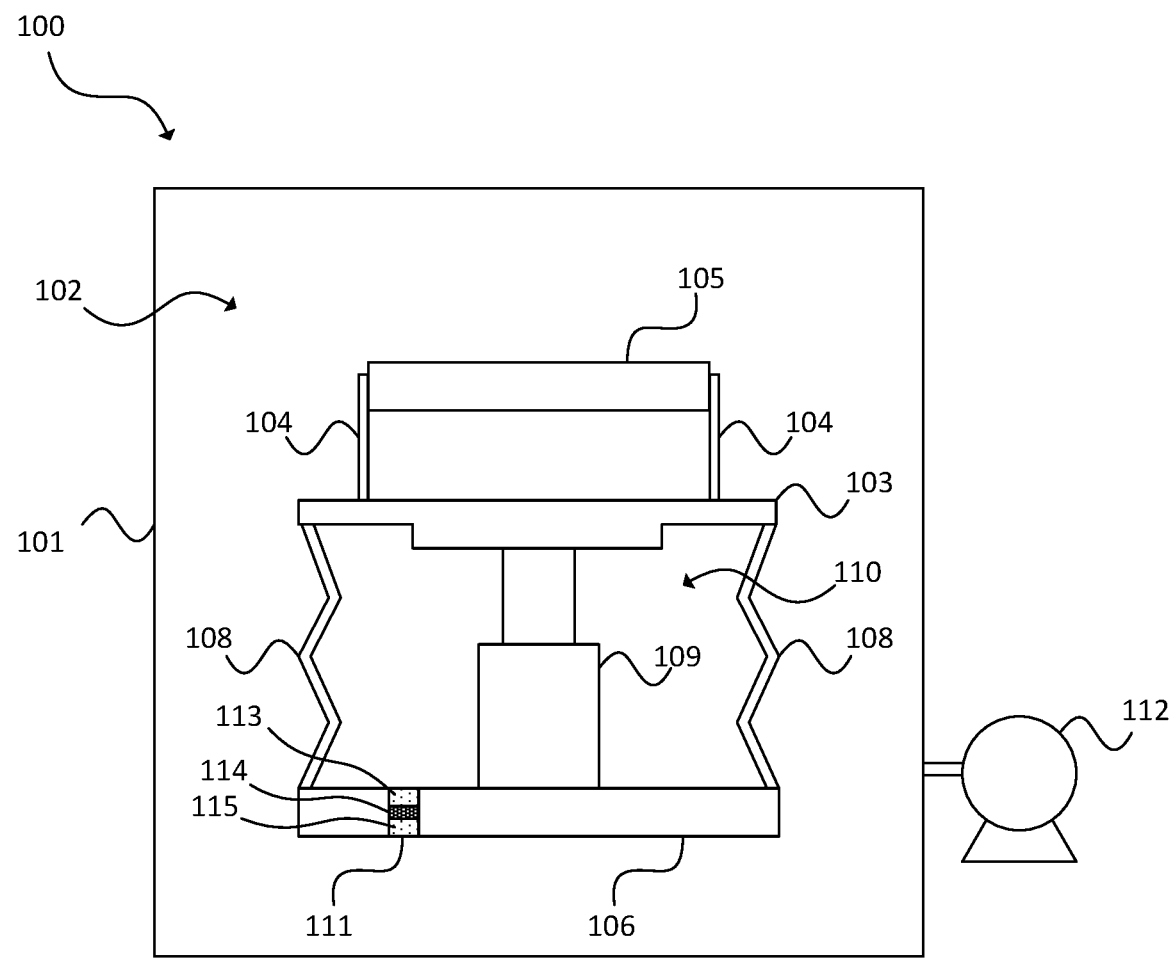
FIG. 1 is a cross-sectional diagram of a system embodiment in accordance with the present disclosure.

FIG. 1 is a cross-sectional diagram of a system 100. The system 100 includes a vacuum chamber 101. In an instance, the vacuum chamber 101 is part of an EUV semiconductor inspection tool. The optical component 105 is inside the vacuum chamber. Walls of the vacuum chamber 101 define an interior 102, which can be pumped to low or vacuum pressures. The vacuum pressure may be as low as $10^{-7}$ Torr. Partial pressure for hydrocarbons may be as low as $10^{-12}$ Torr.

In an instance, the vacuum chamber 101 can operate in ultra-high vacuum (UHV). The total pressure in the vacuum chamber 101 can be UHV (e.g., $<10^{-6}$ Torr), but the majority of that is water vapor. The partial pressure due to hydrocarbons can be lower (e.g., $<10^{-6}$ Torr).

The optical component 105 can be held by an optic mount 103. The optic mount 103 includes supports 104. The supports 104 can hold the optical component 105.

The optical component 105 can be, for example, a lens, mirror, aperture, sensor, filter, attenuator, or shutter. The optical component 105 can be configured for use at EUV wavelengths. In another instance, the optical component 105 is a mask. The mask may not include a pellicle, so even one particle on the mask can mean failure during operation. The optical component 105 can be other components that are actuated remotely in vacuum.

EUV light or light at other wavelengths can be directed through the optical component 105. There may be a light source in the vacuum chamber 101.

The optic mount 103 is connected to a base 106. A bellows 108 is positioned between the base 106 and the optic mount 103. The bellows 108 provides a seal between the base 106 and the optic mount 103. This seal may provide several orders of magnitude of protection with molecules. For example, the seal may provide a protection factor of approximately $10^8$. Nearly all particles with a size of 10 nm or larger can be contained using the bellows 108.

The base 106 may be on feet or other supports (not illustrated) so that at least part of the exterior of the base 106 is exposed to the vacuum chamber 101. This can allow gas flow to the actuator compartment 110.

The bellows 108, the base 106, and the optic mount 103 define an actuator compartment 110 therebetween. FIG. 1 is a cross-sectional view, so the bellows 108 may extend around an entirety of the base 106 and optic mount 103 to seal the actuator compartment 110. The bellows 108 may be connected to the base 106 and optic mount 103 using welding, brazing, soldering, or other techniques.

In an instance, the bellows 108 are fabricated of stainless steel. This includes 304, 316, 316L, or 310 stainless steel. The bellows 108 also can be fabricated of Ivar, Super Invar, aluminum, Hastelloy C-276, Hastelloy C-22, Hastelloy X, Monel 400, nickel 200, Inconel 600, or other materials. The bellows 108 can be any flexible material that is vacuum compatible and can prevent the majority of contaminant passage.

An actuator 109 is positioned in the actuator compartment. The actuator 109 is configured to move the optic mount 103 relative to the base 106. The actuator 109 typically has lubricant for operation, and any movement by the actuator 109 can generate particles and VOCs. The particles are typically made of the materials in or around the vacuum chamber 101 or the materials in the filter assembly 111. For example, two components in the vacuum chamber 101 may rub together and form particles. VOCs can be lubricants, cleaning agents, residues from a machine shop, or the materials in the vacuum chamber 101.

Thus, particles can occur due to shedding of material caused by some disturbance. The particles generally are made of the same material as the actuator (e.g., metals, plastics, and lubricants). These can be shredded material from two materials rubbing together or dislodgement of loosely-adhered material (e.g., deposited particles, lubricants, etc.) caused by movement and vibration. Generally, anything that moves (e.g., actuator 109) can generate particles. In addition, even static items can generate VOCs either as the material degrades or as adhered volatile compounds evaporate through outgassing.

Lubricants generate outgas, but outgassing can come from the material itself as it breaks down. For example, plastics can outgas. Outgassing also can come from molecular contaminates adhered to otherwise clean surfaces like metal. Contaminates generally comes from residual contamination during manufacture.

A size of the particles can depend on which parts move, materials, or surface finishes. Particles may be 5 nm or larger in diameter, such as 10 nm or larger in diameter.

A filter assembly 111 is in fluid communication between the actuator compartment 110 and an interior 102 of the vacuum chamber 101. In an instance, the filter assembly 111 in in the bottom 106. The filter assembly 111 allows gas flow between the actuator compartment 110 and interior 102 of the vacuum chamber 101. Thus, pressure in the actuator compartment 110 can be reduced using the same pump 112 as the interior 102 of the vacuum chamber 101. The pressure in the actuator compartment 110 can be the same as the interior 102 of the vacuum chamber 101 after pumpdown.

To remove trapped gas within the actuator compartment 110 during system pumpdown, light atmospheric gases (e.g., hydrogen, nitrogen, oxygen, or water) can escape the actuator compartment 110 through the filter assembly 111. The filter assembly 111 captures particles and VOCs, which prevents particles and VOCs from reaching the optical component 105 or other sensitive components in the system 100. In an instance, the filter assembly 111 can capture particles and VOCs with a diameter of 3 nm or larger. For example, approximately 100% of particles that have a diameter 10 nm or larger are captured. More than 75%, more than 80%, more than 85%, more than 90%, or more than 95% of particles that have a diameter of 3 nm or larger are captured.

The filter assembly 111 is positioned in the base 106 instead of in the optic mount 103. Thus, any particles or contaminants not captured by the filter assembly 111 are expelled on a side opposite from the optical component 105, which lessens the probability of a particle or contaminant impacting the optical component 105. Of course, the filter assembly 111 also can be positioned in the optic mount 103 if the particle or contaminant capture levels are acceptable or if smaller particles are less of a concern.

The filter assembly 111 includes a first particle filter 113, a second particle filter 115, and a purifier medium 114 disposed between the first particle filter 113 and the second particle filter 115.

The first particle filter 113 can be a particle blocking material, such as a sintered metal (e.g. Mott material) or a fine wire mesh that will capture particles. The sintered material, mesh, or combination thereof can have a porosity or mesh type to filter sizes of particles that are contained in the actuator compartment 110 (i.e., away from the optical component 105). The purifier medium 114 can be a chemically-active adsorber substance that can adsorb VOCs. An adsorber substance can adsorb VOC or other chemical species on the surface (mostly the internal surface) of a granule, bead, or crystal of adsorbent material. The adsorber substance can be activated carbon, zeolites, silica gels, or polymers. A second particle filter 115 is an additional particle filter that can prevent the purifier medium 114 from generating particles.

The first particle filter 113 and second particle filter 115 may have different specifications. Thus, the material or other parameters of the first particle filter 113 and second particle filter 115 can be different.

In an instance, the first particle filter 113 and second particle filter 115 may be a mesh made of metal.

For example, the first particle filter 113 and/or second particle filter 115 can have a stainless steel (e.g., 316L) thickness from 0.039 inch to 0.125 inch. This thickness also can apply to 310 stainless steel, 304 stainless steel, Hastelloy C-276, Hastelloy C-22, Hastelloy X, Monel 400, nickel 200, Inconel 600. To capture VOCs, the minimum thickness of the first particle filter 113 and/or second particle filter 115 may be greater than 0.25 inch. The maximum thickness may be governed by space constraints, but may be less than 0.125 inch.

The purifier medium 114 can include at least one of activated carbon, a zeolite, a silica gel, or a polymer. The purifier medium 114 can be tailored to the outgassing species that to be adsorbed. For example, a bed of purifier medium 114 with a desired grain or pore size or with a chemically active surface can be selected.

The purifier medium 114 can absorb VOCs, such as through physisorption due to high surface area and affinity for hydrocarbons. A thickness of the purifier medium 114 can be related to capture efficiency and total absorption capacity. To capture VOCs, the minimum thickness of the purifier medium 114 may be greater than 0.25 inch. The maximum thickness may be governed by space constraints.

The filter assembly 111 can filter particles that have a size of 3 nm or greater. A majority of VOCs can be captured by the filter assembly 111.

Activated carbon for the purifier medium 114 can be made by the pyrolysis of coal, wood, bark, coconut shells, etc. The substance is activated in a high temperature, controlled oxidation process. Activated carbon tends to have a large surface area.

Zeolites can be used to remove VOCs. For example, naturally-occurring zeolites such as alumino-silicate crystals are hydrophilic, which means these zeolites have an affinity for polar molecules, such as water. Dealuminizing a natural zeolite can render it hydrophobic, which means the dealuminized zeolites have an affinity for non-polar substances, such as many VOCs. Hydrophobic zeolites can be synthesized in crystals from 1 micron to 1 millimeter in diameter, and can be bonded into larger granules to lower their resistance to air flow.

Polymer-based adsorbents can be manufactured with pores designed for a particular application. These pores can range from macro-porous through molecular sizes. Polymers are used as granules or beads. Some polymers have been observed to desorb faster than carbon. Like carbon, polymers are not typically considered highly-selective as to which VOC they will adsorb, although some polymers will adsorb some VOCs better than others.

In an instance, the purifier medium 114 is a combination of materials disclosed herein.

In an instance, the first particle filter 113 and the second particle filter 115 are a mesh of metal and the purifier medium 114 includes activated carbon.

A filter assembly 111 may last ten years or more between replacements, but more frequent replacements are possible. There may not be a continuous flow of gas through the filter assembly 111, so a long lifetime is possible.

As seen in FIG. 1, the actuator 109 that generates molecular and particle contaminants is separated from the vacuum environment of the optical surface of the optical component 105. The 108 bellows allows the actuator 109 to move, but can be connected to the optic mount 103 and base 106 with gas-impermeable welds. This allows in-situ movement of the optical component 105 for alignment under vacuum with lower risk of contaminating the optical component 105 or other optics in the system with particles or VOCs. The embodiments disclosed herein can be self-contained and may not use separate vacuum pumping beyond the pump 112 for the vacuum chamber 101.

Figure 2:
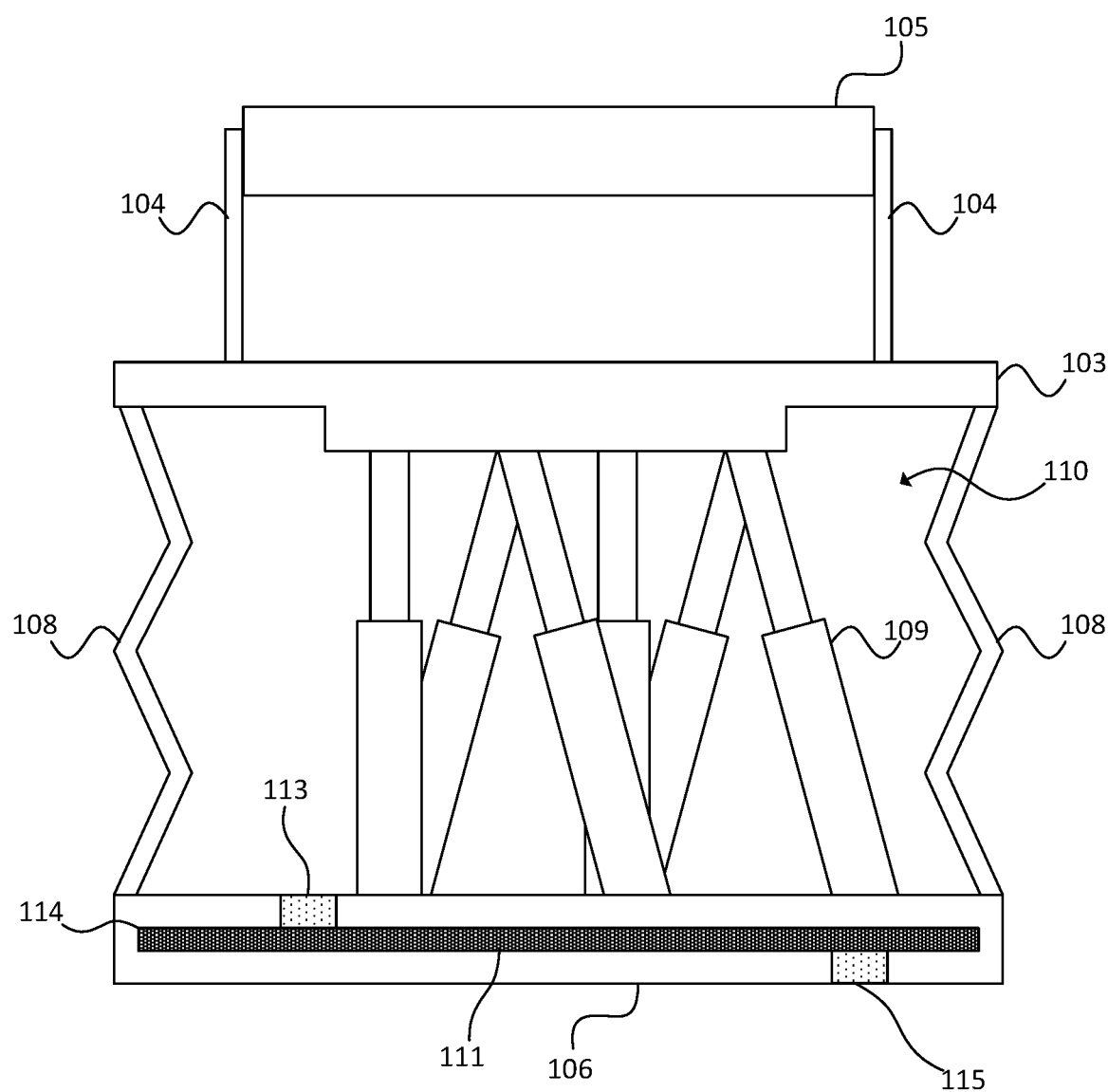
FIG. 2 is another cross-sectional diagram of part of a system embodiment in accordance with the present disclosure.

FIG. 2 is another cross-sectional diagram of part of a system 100. In this embodiment, the actuator 109 is a hexapod, combination of linear actuators, or an actuator with rotational capability. The filter assembly 111 passes light gases, but blocks particles and adsorbs VOCs. The actuator compartment 110 is sized appropriately and the bellows are positioned to enable desired movement by the actuator 109. While illustrated in the base 106, the purifier medium 114 can extend to the edges of the base 106 if sealed. A final interface from the filter assembly 111 to the interior 102 of the vacuum chamber 101 can be the second particle filter 115 to prevent the purifier medium 114 itself from generating particles. The purifier medium 114 may be a fine powder.

In FIG. 2, the filter assembly 111 is built into the base 106 with the first particle filter 113 or second particle filter 115 on either end. The gas flow through filter assembly 111 is in series through the first particle filter 113, purifier medium 114, and second particle filter 115. When both the vacuum chamber 101 and actuator compartment 110 are at vacuum pressure there will be little total flow through the filter assembly 111.

Figure 3:
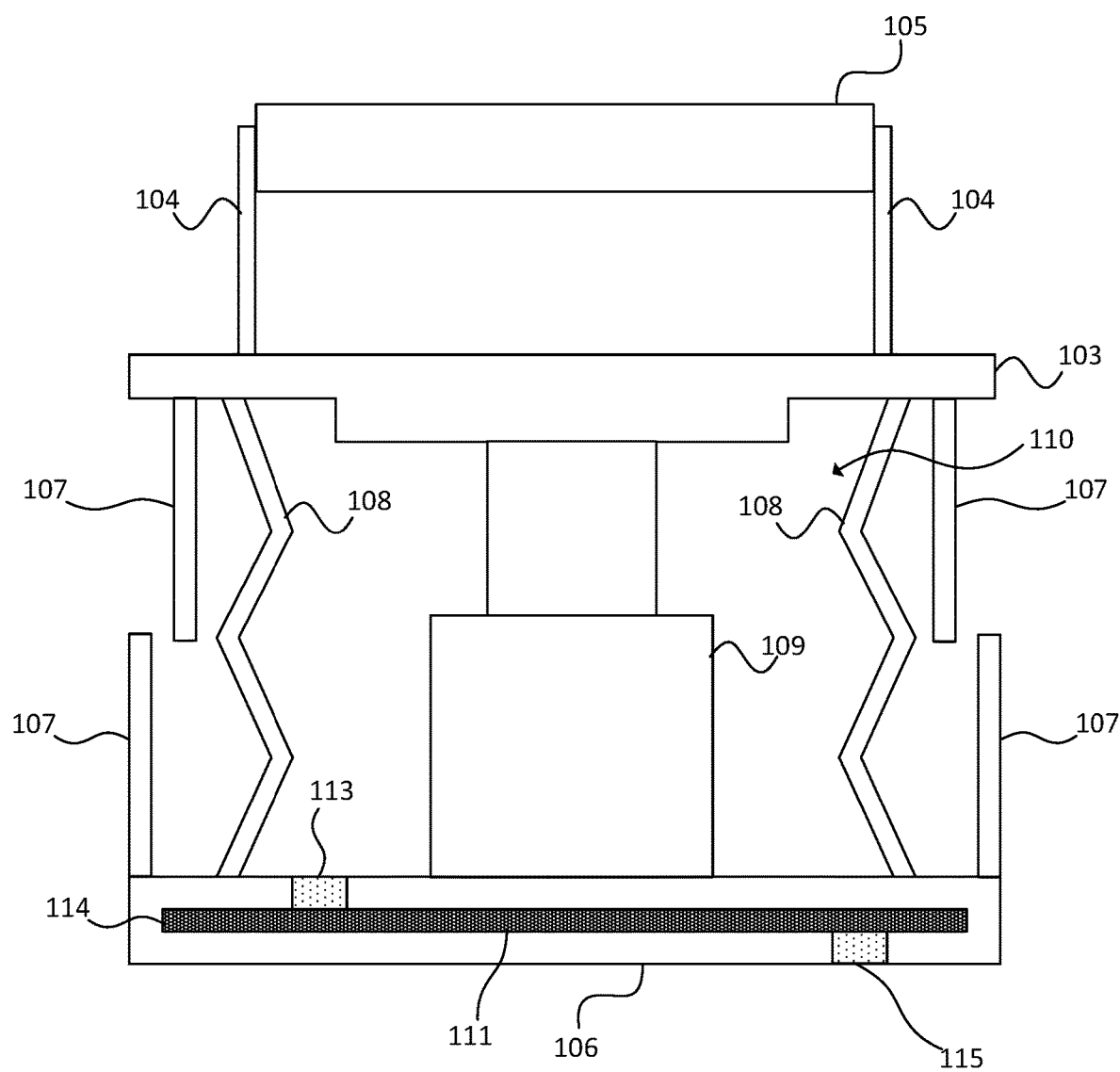
FIG. 3 is another cross-sectional diagram of part of a system embodiment in accordance with the present disclosure.

FIG. 3 is another cross-sectional diagram of part of a system. Baffles 107 are disposed on the optic mount 103 and the base 107 on a side of the bellows 108 outside the actuator compartment 110. The baffles 107 on the optic mount 103 extend toward the base 106. The baffles 107 on the base 106 extend toward the optic mount 103. To mitigate particle generation from the bellows 108 during actuation, the baffles 107 can be positioned outside the bellows 108 to create a labyrinthine path for particles.

Baffles 107 also can be positioned on the optic mount 103 and/or base 107 inside the actuator compartment 110. This can capture particles before they reach the filter assembly 111.

Figure 4:
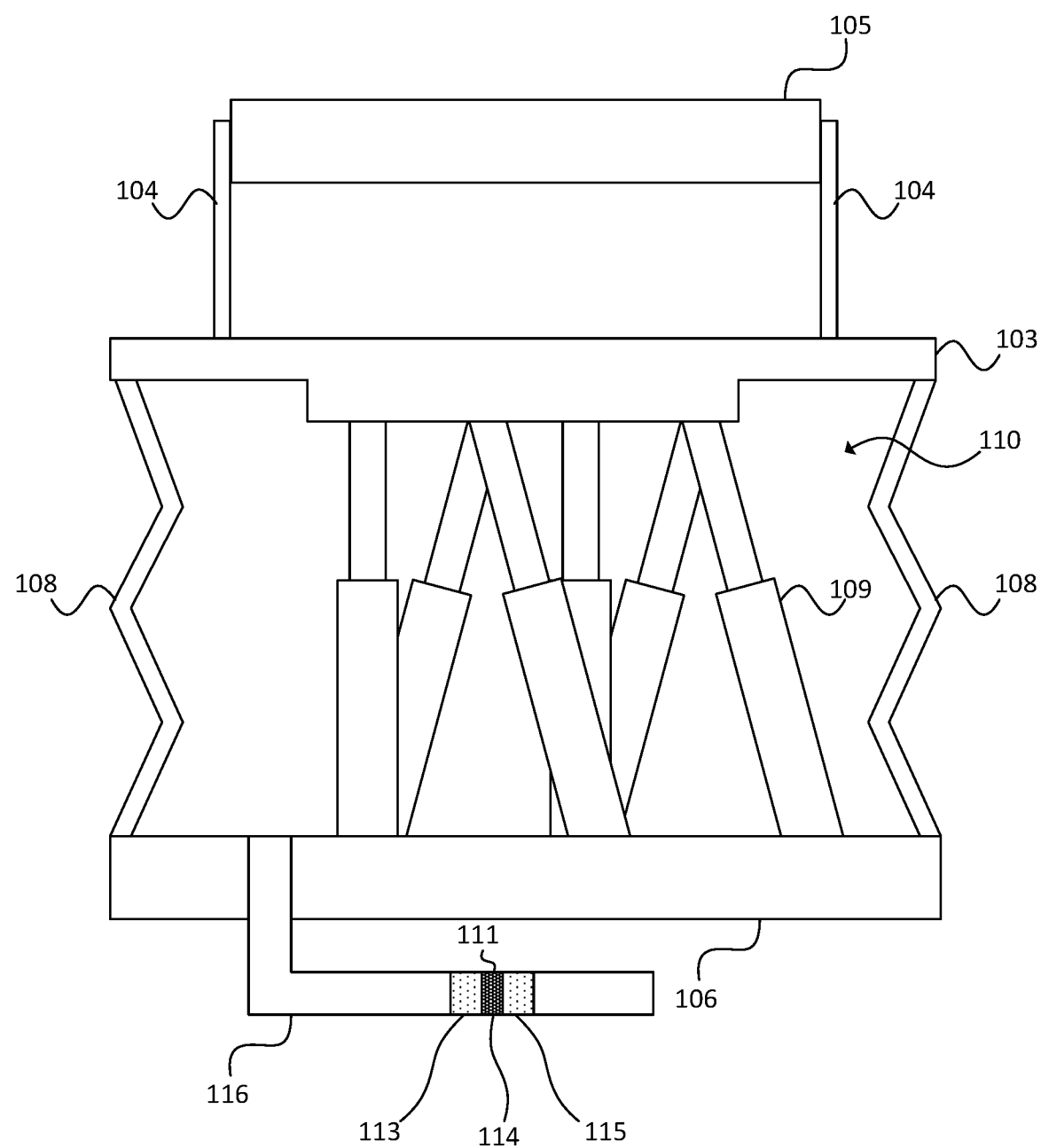
FIG. 4 is another cross-sectional diagram of part of a system embodiment in accordance with the present disclosure.

FIG. 4 is another cross-sectional diagram of part of a system 100. A gas pathway 116 is disposed on the base 106. The gas pathway 116 is in fluid communication between the actuator compartment 110 and a vacuum chamber on the other side of the base 106. The filter assembly 111 is disposed in the gas pathway 116.

The gas pathway 116 can be a pipe, duct, or conduit. The gas pathway 116 is illustrated as terminating under the base 106, but can be connected to a more remote location. For example, the gas pathway 116 may terminate at a vacuum pump for the vacuum chamber 101, somewhere outside the vacuum chamber 101, or a separate vacuum pump for the actuator compartment 110.

If the gas pathway 116 is used, the base 106 may be mounted flat on a surface in the vacuum chamber 101. The gas pathway 116 can be formed through the surface that the vacuum chamber 101 is mounted on.

Figure 5:
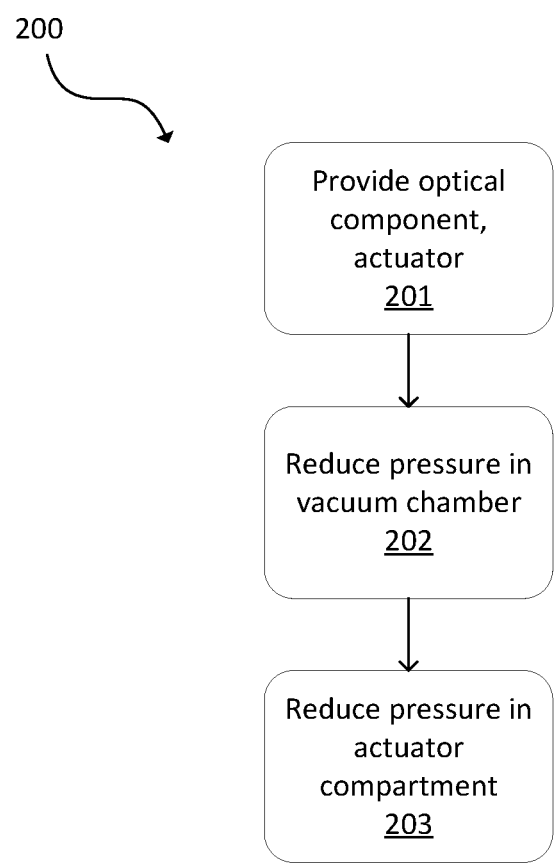
FIG. 5 is a flowchart of a method embodiment in accordance with the present disclosure.

FIG. 5 is a flowchart of a method 200. The method 200 can be used in a system, such as the system 100. An optical component is provided on an optic mount in a vacuum chamber at 201. An actuator disposed between the optic mount and a base also is provided at 201. A bellows is disposed between the base and the optic mount. The bellows, the base, and the optic mount define an actuator compartment therebetween. The bellows provides a seal between the base and the optic mount.

Pressure is reduced in the vacuum chamber, which surrounds the optical component and bellows, with a vacuum pump at 202.

Pressure in the actuator compartment is reduced with the vacuum pump at 203. Gas evacuated from the actuator compartment passes through a filter assembly between the actuator compartment and the vacuum chamber. The filter assembly includes a first filter, a purifier medium, and a second filter. The first filter and/or the second filter can be a mesh made of metal. The purifier medium can include at least one of activated carbon, a zeolite, a silica gel, or a polymer. In an instance, the first filter and the second filter are a mesh made of metal, and the purifier medium includes activated carbon. The filter assembly can disposed in the base or in a gas pathway disposed on the base.

The optic mount can be moved relative to the base using the actuator. A beam of EUV light can be directed through the vacuum chamber at the optical component.

While disclosed as reducing particles and contamination on the optical components, the embodiments disclosed herein also can protect the actuator from the environment outside the actuator compartment. When cleaning the area with the optical component, solvents, plasma, $O_3$, ultraviolet light, and/or $H_2$ may be used. These cleaning techniques can damage the actuator. The bellows and filter assembly can protect the actuator from these cleaning techniques.

While the description provided throughout the present disclosure has focused on particle control around an optical component in an EUV lithography tool, EUV metrology tool, or EUV reticle inspection tool, the embodiments disclosed herein should be interpreted to apply to any critical region of an EUV optical tool or optical tool for other light wavelengths that is sensitive to the presence of particles. Embodiments disclosed herein also can be applied to other vacuum systems that are sensitive to particles, such as electron beam systems.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
    a vacuum chamber;
    an optic mount disposed in the vacuum chamber;
    an optical component disposed on the optic mount in the vacuum chamber;
    a base;
    a bellows disposed between the base and the optic mount, wherein the bellows, the base, and the optic mount define an actuator compartment therebetween, wherein the bellows provides a seal between the base and the optic mount;
    an actuator disposed in the actuator compartment, wherein the actuator is configured to move the optic mount relative to the base; and
    a filter assembly disposed in fluid communication between the actuator compartment and an interior of the vacuum chamber, wherein the filter assembly includes a first particle filter, a second particle filter, and a purifier medium disposed between the first particle filter and the second particle filter.

2. The system of claim 1, wherein the filter assembly is disposed in the base.

3. The system of claim 1, further comprising a gas pathway disposed on the base, wherein the gas pathway is in fluid communication between the actuator compartment and the vacuum chamber, and wherein the filter assembly is disposed in the gas pathway.

4. The system of claim 1, wherein the bellows is fabricated of stainless steel.

5. The system of claim 1, wherein at least one of the first particle filter and the second particle filter is a mesh of metal.

6. The system of claim 1, wherein at least one of the first particle filter and the second particle filter is a sintered metal.

7. The system of claim 1, wherein the purifier medium includes at least one of activated carbon, a zeolite, a silica gel, or a polymer.

8. The system of claim 1, wherein the first particle filter and the second particle filter are a mesh of metal, and wherein the purifier medium includes activated carbon.

9. The system of claim 1, further comprising a plurality of baffles disposed on the optic mount on a side of the bellows opposite the actuator compartment, wherein the baffles extend toward the base.

10. The system of claim 1, wherein the filter assembly captures more than 90% of particles that have a diameter of 3 nm or larger.

11. The system of claim 1, wherein the optical component is configured for use at extreme ultraviolet wavelengths.

12. An extreme ultraviolet semiconductor inspection tool including the system of claim 1.

13. A method comprising:
    providing an optical component on an optic mount in a vacuum chamber;
    providing an actuator disposed between the optic mount and a base, wherein a bellows is disposed between the base and the optic mount, wherein the bellows, the base, and the optic mount define an actuator compartment therebetween, and wherein the bellows provides a seal between the base and the optic mount;
    reducing a pressure in the vacuum chamber with a vacuum pump; and
    reducing a pressure in the actuator compartment with the vacuum pump, wherein gas evacuated from the actuator compartment passes through a filter assembly between the actuator compartment and the vacuum chamber, and wherein the filter assembly includes a first filter, a purifier medium, and a second filter.

14. The method of claim 13, wherein the filter assembly is disposed in the base.

15. The method of claim 13, wherein the filter assembly is disposed in a gas pathway disposed on the base.

16. The method of claim 13, wherein the first filter and/or the second filter is a mesh made of metal, and wherein the purifier medium includes at least one of activated carbon, a zeolite, a silica gel, or a polymer.

17. The method of claim 13, further comprising moving the optic mount relative to the base using the actuator.

18. The method of claim 13, further comprising directing a beam of extreme ultraviolet light through the vacuum chamber at the optical component.

19. The method of claim 13, wherein the filter assembly captures more than 90% of particles that have a diameter of 3 nm or larger.

20. The method of claim 13, wherein the pressure is less than $10^{-6}$ Torr.

* * * * *